United States Patent
Beccue

(10) Patent No.: US 9,473,069 B1
(45) Date of Patent: Oct. 18, 2016

(54) APPARATUS AND METHODS FOR PHASE LINEARIZATION AND INTERPOLATION IN ROTARY TRAVELING WAVE OSCILLATORS

(71) Applicant: ANALOG DEVICES, INC., Norwood, MA (US)

(72) Inventor: Stephen Mark Beccue, Thousand Oaks, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/919,964

(22) Filed: Oct. 22, 2015

(51) Int. Cl.
H03B 27/00 (2006.01)
H03B 5/18 (2006.01)
H03K 3/03 (2006.01)

(52) U.S. Cl.
CPC ............ *H03B 5/1852* (2013.01); *H03B 5/18* (2013.01); *H03B 27/00* (2013.01); *H03K 3/0315* (2013.01); *H03B 2200/0016* (2013.01)

(58) Field of Classification Search
CPC  H03B 5/18; H03B 2200/0016; H03B 27/00; H03K 3/0315; H03K 3/03; H03K 27/00
USPC ........................................ 331/45, 57, 107 SL
See application file for complete search history.

(56) References Cited

U.S. PATENT DOCUMENTS

| | | | |
|---|---|---|---|
| 6,249,189 B1 | 6/2001 | Wu et al. | |
| 6,556,089 B2 | 4/2003 | Wood | |
| 7,236,060 B2 | 6/2007 | Wood | |
| 7,683,726 B2 | 3/2010 | Kim | |
| 9,209,745 B2 * | 12/2015 | Beccue | H03B 5/18 |
| 2009/0215423 A1 | 8/2009 | Hwang et al. | |
| 2010/0117744 A1 * | 5/2010 | Takinami | H03K 3/86 331/45 |
| 2012/0013408 A1 | 1/2012 | Cortadella et al. | |

(Continued)

FOREIGN PATENT DOCUMENTS

| | | |
|---|---|---|
| JP | 2001-036387 A | 2/2001 |
| WO | WO 2006/133225 A2 | 12/2006 |
| WO | WO 2012/094051 A2 | 7/2012 |

OTHER PUBLICATIONS

Shima, Takeshi, "CMOS Ring Oscillator Array with Braided Connections," IEEE International 9th New Circuits and Systems Conference, NEWCAS2011, pp. 149-152, Jun. 2011.

*Primary Examiner* — Arnold Kinkead
(74) *Attorney, Agent, or Firm* — Knobbe Martens Olson & Bear LLP

(57) ABSTRACT

Apparatus and methods for phase linearization and interpolation in rotary traveling wave oscillators (RTWOs) are provided. In certain configurations, an RTWO system includes a first elongated RTWO and a second elongated RTWO that are phase-locked to one another with a non-zero phase shift. The first and second elongated RTWOs each include two elongated sections of differential transmission line of high phase linearity. For example, such long and straight sections of the differential transmission lines can have uniform capacitance loading and avoid non-uniformities in length and/or thickness associated with poor phase linearity. The RTWO system further includes tap circuitry that receives clock signal phases from the elongated sections of the RTWOs. In certain implementations, the tap circuitry includes one or more interpolation circuits that interpolate received clock signal phases to increase the number of available phases. The RTWO system can include a large number of taps of high phase linearity.

21 Claims, 9 Drawing Sheets

(56) References Cited

U.S. PATENT DOCUMENTS

2012/0112841 A1    5/2012  Hayashi
2013/0154750 A1    6/2013  Martchovsky
2015/0222287 A1*   8/2015  Tekin .................. H03M 1/0836
                                                            375/355

* cited by examiner

APPARATUS AND METHODS FOR PHASE LINEARIZATION AND INTERPOLATION IN ROTARY TRAVELING WAVE OSCILLATORS

BACKGROUND

1. Field

Embodiments of the invention relate to electronic systems, and more particularly, to rotary traveling wave oscillators.

2. Description of the Related Technology

Multiphase oscillators can be used in a variety of applications, including, for example, telecommunications, optical networks, radar systems, and/or chip-to-chip communication. For instance, a multiphase oscillator can be included in a frequency synthesizer to generate an output clock signal that has a controlled phase and frequency relationship relative to a reference clock signal. Multiphase oscillators can also be used in data converters, such as analog-to-digital converters (ADCs).

There is a need for improved multiphase oscillators.

SUMMARY

In one aspect, an apparatus including a rotary traveling wave oscillator (RTWO) system is provided. The RTWO system includes a first elongated RTWO including a first differential transmission line in a closed loop, and the first differential transmission line includes one or more elongated sections that generate a first plurality of clock signal phases. The RTWO system further includes a second elongated RTWO including a second differential transmission line in a closed loop, and the second differential transmission line includes one or more elongated sections that generate a second plurality of clock signal phases. The second elongated RTWO is phase-locked to the first elongated RTWO with a phase shift. The RTWO system further includes tap circuitry configured to receive the first plurality of clock signal phases from the first elongated RTWO and the second plurality of clock signal phases from the second elongated RTWO.

In another aspect, an electronically implemented method of electronic oscillation is provided. The method includes phase-locking a first elongated RTWO to a second elongated RTWO with a phase shift, generating a first plurality of clock signal phases using one or more elongated sections of a first differential transmission line of the first elongated RTWO, generating a second plurality of clock signal phases using one or more elongated sections of a second differential transmission line of the second elongated RTWO, and providing the first plurality of clock signal phases and the second plurality of clock signal phases to tap circuitry.

In another aspect, a phase interpolation system is provided. The phase interpolation system includes a transmission line and a phase interpolation circuit. The phase interpolation circuit includes a plurality of phase interpolators included a first phase interpolator configured to receive a plurality of input clock signal phases. The plurality of input clock signal phases includes a first input clock signal phase taken from a first position along the transmission line and a second input clock signal phase taken from a second position along transmission line. The first phase interpolator is configured to generate one or more interpolated clock signal phases by interpolating between the first input clock signal phase and the second input clock signal phase.

DETAILED DESCRIPTION OF EMBODIMENTS

Figure 1A:
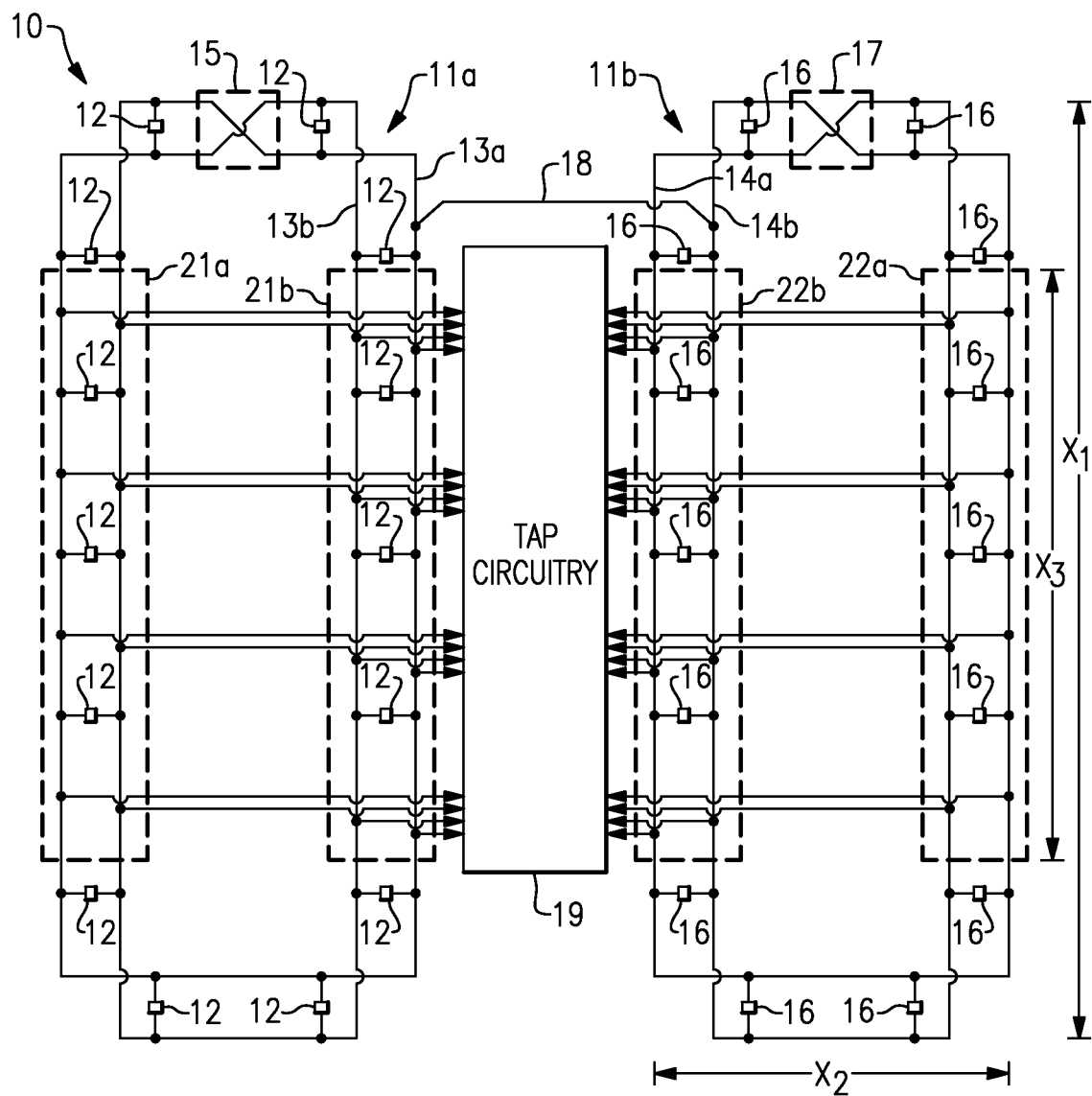
FIG. 1A is a schematic diagram of one embodiment of rotary traveling wave oscillator (RTWO) system.

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

A rotary traveling wave oscillator (RTWO) is a type of electronic oscillator that includes a differential transmission line connected in a closed loop, an odd number of one or more cross-overs, and a plurality of regeneration circuits electrically connected along a path of the differential transmission line. Additionally, each of the cross-overs reverses the polarity of a wave propagating along the differential transmission line, and the regeneration circuits provide energy to the wave to compensate for the differential transmission line's losses. Additional details of RTWOs can be as described in commonly-owned U.S. Pat. No. 6,556,089, issued Apr. 29, 2003, and titled "ELECTRONIC CIRCUITRY," which is hereby incorporated by reference in its entirety herein.

As persons having ordinary skill in the art will appreciate, clock signal phase can represent a fraction of a complete clock signal cycle elapsed as measured from a specified reference point. For clarity of the description, a clock signal phase local to a certain position along a transmission line may be referred to herein as having a phase of about 0°. However, skilled artisans will appreciate that clock signal phase can be defined relative to other reference points.

In an RTWO, a traveling wave propagates along a differential transmission line. By tapping the differential transmission line at various positions, clock signals of different phases can be obtained. In one example, a tap circuit, such as an inverter or amplifier, can include an input electrically connected to a particular position of the differential transmission line to obtain a clock signal having a desired phase.

In certain implementations, a differential transmission line can include taps that are spaced apart or spread out substantially evenly along the transmission line. For instance, tapping an RTWO using n tap circuits that are evenly spaced along the transmission line can be used to generate clock signals that are ideally spaced in phase by about 360/n degrees (°).

The phase linearity of an RTWO's taps can be an important performance specification. In one example, an RTWO is included in a frequency synthesizer, and the RTWO's phase linearity impacts the frequency synthesizer's jitter and/or spectral purity of synthesized output clock signals. In another example, an RTWO is included in an analog-to-digital converter (ADC), and the RTWO's phase linearity impacts the ADC's linearity and/or resolution.

The number or density of taps of an RTWO can also be important for a variety of applications. For instance, a frequency synthesizer can include an RTWO that is integer locked to a low noise reference clock signal, and output clock signals of desired frequencies can be synthesized by selecting phases of the RTWO using, for instance, a digital phase selection circuit. In such a system, a number of available frequencies for synthesis depends on a number of available RTWO phases, and thus on the density of the RTWO's taps. In another example, an ADC can include an RTWO, and the resolution of the ADC depends on the density of taps of the RTWO.

It can be difficult to implement an RTWO with a large number of taps and/or with taps having high phase linearity. For example, layout constraints, such as limitations in metal routing, can limit the maximum number of taps that an RTWO can provide. Additionally, a layout of an RTWO's differential transmission line can impact the phase linearity of the RTWO's taps. For example, corners and/or curves can generate transmission line non-uniformities, which can degrade phase linearity. Moreover, the RTWO's cross-overs can also impact phase linearity, since the cross-overs can operate as a non-uniformity to the traveling wave that propagates along the differential transmission line.

Moreover, the phase linearity of an RTWO can be constrained by design rules of a manufacturing process used to fabricate the RTWO. For instance, a manufacturing process can include design rules specifying transistor layouts to be orthogonal. Thus, even if the layout of the RTWO's differential transmission line were circular, the layout of transistors used in the RTWO's regeneration circuits and/or tap circuitry may not match the curves of the RTWO. Accordingly, it can be difficult to implement an RTWO with a larger number of taps of high phase linearity.

In certain configurations herein, an RTWO system includes a first elongated RTWO and a second elongated RTWO that are phase-locked to one another with a non-zero phase shift. The first and second elongated RTWOs each include a differential transmission line having a ring-shaped layout that is elongated in a first direction. Each of the ring-shaped layouts includes two elongated sections of differential transmission line having excellent phase linearity. For example, such long and straight sections of the differential transmission lines can have uniform capacitance loading and avoid non-uniformities in length and/or thickness associated with poor phase linearity. Moreover, such sections include uniform layouts for transistors used in regeneration circuits and/or tap circuits.

Accordingly, using elongated RTWOs with relatively long and narrow transmission lines can provide sections of transmission line of comparatively good phase linearity. By locking two or more of such RTWOs at a non-zero phase difference, four or more elongated sections of transmission line with excellent linearity can be achieved. Each elongated section can provide more than 90° of clock signal phases. The RTWOs are phase-locked such that the elongated sections provide clock signal phases across the full 360° range. The taps exhibit excellent linearity, since the elongated sections include substantially straight sections of transmission line conductors, and thus avoid the curves, corners, and/or cross-overs associated with poor phase linearity performance.

In certain configurations herein, phase interpolation between adjacent taps is used to increase the available number of clock signal phases. The phase interpolation can be achieved using, for example, capacitor and/or transistor mixing. The phase interpolation circuits can be used to provide interpolated phase taps by mixing proportions of adjacent taps. The inputs of the interpolation circuits are connected along different positions of the differential transmission lines. Although the interpolation circuits have an input capacitance, such circuits operate without corresponding $CV^2f$ power loss, where C is capacitance, V is voltage and f is frequency, since the input capacitance operates as part of the characteristic impedance of the transmission line.

The teachings herein can be used in a wide variety of applications. In one example, an ADC includes an RTWO system that provides the ADC with a relatively large number of clock signal phases of high phase linearity. The ADC can be implemented as, for example, a dual or single slope ADC, and the clock signal phases generated by the RTWO system control counting. In such a configuration, the phase linearity and/or density of taps control the linearity and/or resolution of the ADC.

In another example, the RTWO system is included in a Doppler frequency synthesizer, which uses the clock signal phases generated by the RTWO system for frequency synthesis. For example, an output clock signal from the RTWO system can be integer-locked to a low phase noise reference signal, and the clock signal phases of the RTWO system can be processed using digital control to synthesize a variety of output clock signals of different frequencies and/or phases. A Doppler synthesizer can exhibit spurious output frequencies when the clock signal phases have poor linearity, and a phase separation between taps provides a fundamental limit on root mean square (RMS) output jitter. Accordingly, including an RTWO system with a large number of taps of high phase linearity in a Doppler frequency synthesizer can enhance performance by improving output spectral purity and/or reducing jitter.

FIG. 1A is a schematic diagram of one embodiment of an RTWO system 10. The RTWO system 10 includes a first elongated RTWO 11a, a second elongated RTWO 11b, and tap circuitry 19 that receives clock signal phases from both the first elongated RTWO 11a and from the second elongated RTWO 11b.

In the illustrated configuration, the RTWO system 10 includes two RTWOs. However, the RTWO system 10 can include additional RTWOs, including, for example, 3 or more RTWOs.

The first elongated RTWO 11a includes a differential transmission line including a first conductor 13a and a second conductor 13b. The first elongated RTWO 11a further includes a cross-over 15 and regeneration circuits 12. The second elongated RTWO 11b includes a differential transmission line including a first conductor 14a and a second conductor 14b. The second elongated RTWO 11b further includes a cross-over 17 and regeneration circuits 16.

In the illustrated embodiment, the first and second elongated RTWOs 11a, 11b each include one cross-over and fourteen regeneration circuits. However, other configurations are possible, including, for example, configurations using a different number of cross-overs and/or more or fewer regeneration circuits. Furthermore, the RTWO system can include additional RTWOs and/or other circuitry.

As persons having ordinary skill in the art will appreciate, an RTWO can include a differential transmission line connected in a closed loop, an odd number of one or more cross-overs, and a plurality of regeneration circuits electrically connected along a path of the differential transmission line. Additionally, each of the cross-overs can reverse the polarity of a wave propagating along the differential transmission line, and the regeneration circuits can provide energy to the wave to compensate for the differential transmission line's losses. Additional details of RTWOs can be as described in U.S. Pat. No. 6,556,089, which was incorporated by reference in its entirety earlier.

As shown in FIG. 1A, a phase-locking conductor 18 electrically connects a portion of the first conductor 13*a* of the first elongated RTWO 11*a* and a portion of the second conductor 14*b* of the second elongated RTWO 11*b*. In the illustrated configuration, a phase difference between the first and second elongated RTWOs 11*a*, 11*b* can be controlled by selecting a position on the first conductor 13*a* and a position on the second conductor 14*b* between which the phase-locking conductor 18 connects. However, other configurations are possible, including, for example, implementations in which the first and second elongated RTWOs 11*a*, 11*b* are phase-locked in other ways.

As shown in FIG. 1A, the first elongated RTWO 11*a* is elongated in a first direction (vertically in FIG. 1A). The differential transmission line 13*a*, 13*b* of the first elongated RTWO 11*a* includes a first elongated section 21*a* and a second elongated section 21*b* that provide clock signal phases of high phase linearity to the tap circuitry 19. As shown in FIG. 1A, the first elongated section 21*a* is on a first side of the first elongated RTWO 11*a*, and the second elongated section 21*b* is on a second side of the first elongated RTWO 11*a* that is opposite the first side. Additionally, the second elongated RTWO 11*b* is also elongated in the first direction. The differential transmission line 14*a*, 14*b* of the second elongated RTWO 11*b* includes a first elongated section 22*a* and a second elongated section 22*b* that provide clock signal phases of high phase linearity to the tap circuitry 19. As shown in FIG. 1A, the first elongated section 22*a* is on a first side of the second elongated RTWO 11*b*, and the second elongated section 22*b* is on a second side of the second elongated RTWO 11*b* that is opposite the first side.

The illustrated embodiment includes RTWOs implemented with elongated sections of differential transmission line, which provide clock signal phases of relatively high phase linearity. For example, the elongated sections 21*a*, 21*b* of the first elongated RTWO 11*a* and the elongated sections 22*a*, 22*b* of the second elongated RTWO 11*b* are relatively long in length and are substantially straight, and thus have relatively uniform capacitance loading. In contrast, sections of a differential transmission line that have non-uniformities in length and/or thickness can have comparatively poor phase linearity. In one embodiment, the clock signal phases provided by the first and second elongated RTWOs 11*a*, 11*b* have a phase non-linearity of less than about 10%.

In the illustrated embodiment, the wave velocity along the elongated sections 21*a*, 21*b* of the first elongated RTWO 11*a* and the elongated sections 22*a*, 22*b* of the second elongated RTWO 11*b* is substantially constant. For example, when a traveling wave propagates along a substantially straight section of a differential transmission line with uniform loading, the wave can have a substantially constant wave velocity. Maintaining constant wave velocity along the elongated sections of the first and second elongated RTWO's enhances the phase linearity of clock signal phases generated using the elongated sections.

In one embodiment, an RTWO is elongated to have a length x1 in a first direction that is in the range of about 100 μm to 1000 μm and a width x2 in a second direction perpendicular to the first direction that is in the range of about 10 μm to about 500 μm. In one embodiment, the length x1 is greater than the width x2 by a factor of 2 or more. Although various examples of the dimensions x1 and x2 have been described, other lengths and widths are possible, such as those selected based on application and/or implementation.

In one embodiment, the elongated sections 21*a*, 21*b* of the first elongated RTWO 11*a* and the elongated sections 22*a*, 22*b* of the second elongated RTWO 11*b* have a length x3 in the range of about 90 μm to 900 μm. Although one example range of the length x3 has been provided, other lengths are possible, such as a length selected based on application and/or implementation.

By phase-locking two or more elongated RTWOs with a non-zero phase difference, four or more sections of differential transmission line with high phase linearity can be achieved. Each elongated section can provide more than 90° of clock signal phases, including 45° or more of phase from each of the differential transmission line's conductors. In one embodiment, the elongated sections 21*a*, 21*b* of the first elongated RTWO 11*a* and the elongated sections 22*a*, 22*b* of the second elongated RTWO 11*b* each provide more than 130° of phase. The RTWOs are phase-locked such that the elongated sections provide clock signal phases across the full 360° range. The taps exhibit excellent linearity, since the straight transmission line sections avoid the curves, corners, and/or cross-overs associated with poor phase linearity performance.

Thus, the illustrated configuration advantageously taps the first elongated RTWO 11*a* from the elongated sections 21*a*, 21*b* and taps the second elongated RTWO 11*b* from the elongated sections 22*a*, 22*b*. Thus, the tap circuitry 19 receives clock signal phases from portions of the RTWOs 11*a*, 11*b* having relatively high phase linearity. Moreover, the tap circuitry 19 avoids operating using clock signal phases generated from portions of transmission line near corners, curves, and/or cross-overs, which can have comparatively poor phase linearity.

For example, as shown in FIG. 1A, the elongated sections 21*a*, 21*b* of the first elongated RTWO 11*a* and the elongated sections 22*a*, 22*b* of the second elongated RTWO 11*b* do not include any curves, corners, or cross-overs. Additionally, in the illustrated embodiment, the tap circuitry 19 does not receive any clock signal phases from the first elongated RTWO 11*a* from outside the elongated sections 21*a*, 21*b*. Similarly, in the illustrated embodiment, the tap circuitry 19 does not receive any clock signal phases from the second elongated RTWO 11*b* that are outside of the elongated sections 22*a*, 22*b*. Configuring the RTWO system 10 in this manner provides clock signal phases of high linearity to the tap circuitry 19.

In the illustrated configuration, the tap circuitry 19 receives clock signal phases from two elongated sections 21*a*, 21*b* of the first elongated RTWO 11*a* and from two elongated sections 22*a*, 22*b* of the second elongated RTWO 11*b*. However, other configurations are possible. For example, in another embodiment, four elongated RTWOs are phase-locked, and one elongated section of transmission line from each of the four RTWOs is used to generate clock signal phases for tap circuitry.

Using more than two elongated RTWOs provides averaging that can reduce phase noise and/or reduce components of nonlinearity having a random nature. Further, in such configurations, clock signal phases can be used from the center of elongated sections of the RTWOs while still providing clock signal phases that span the full 360°. Thus, configurations using three or more elongated RTWOs can further increase linearity relative to a configuration using two elongated RTWOs.

Although FIG. 1A illustrates the tap circuitry 19 as being positioned between the first and second elongated RTWOs 11a, 11b, in certain configurations the tap circuitry 19 is integrated in a layout of the first and second elongated RTWOs 11a, 11b. For example, although long wires can be used to route distant clock signal phases to tap circuitry, long wires can also degrade phase linearity, reduce quality factor (Q-factor), and/or otherwise degrade the RTWO system's performance. Accordingly, in certain configurations, transistors of the tap circuitry 19 used for tapping are positioned in close proximity to the differential transmission lines of the first and second elongated RTWOs 11a, 11b.

Since the tap circuitry 19 receives clock signal phases from the elongated sections 21a, 21b of the first elongated RTWO 11a and from the elongated sections of 22a, 22b of the second elongated RTWO 11b, the transistors of the tap circuitry 19 can include uniform layouts associated with high phase linearity. Thus, the layout the tap circuitry's transistors can be uniform, even when the RTWO system 10 is fabricated using a process that includes design rules constraining transistor layouts to be orthogonal.

In contrast, an RTWO that includes taps along the entirety of the RTWO's transmission line can include non-uniform transistor layouts. For example, the layout of transistors used for tapping near curves of the RTWO may have non-uniform layouts relative to transistors used for tapping along straight-sides of an RTWO.

With continuing reference to FIG. 1A, the first and second elongated RTWOs 11a, 11b are phase-locked with a non-zero phase shift. Phase-locking the first and second elongated RTWOs 11a, 11b in this manner can provide clock signal phases to the tap circuitry 19 that span 360°. In contrast, when two RTWOs are phase-locked with a zero degree shift, the elongated sections of the RTWOs can produce redundant clock signal phases for tap circuitry. Thus, the illustrated configuration advantageously includes a phase-shift to increase the number of different clock signal phases available to the tap circuitry 19. The amount of phase shift between the phase-locked RTWOs 11a, 11b can control the angular separation of the clock signal phases provided by the first elongated RTWO 11a and the clock signal phases provided by the second elongated RTWO 11b.

In one embodiment, the first and second elongated RTWOs 11a, 11b are phase-locked by a phase shift θ that is selected to be in the range of about 35° and 55°. However, other configurations are possible, in. For example, a suitable phase shift between RTWOs can be selected based on application and/or implementation.

Additional details of the RTWO system 10 can be as described earlier.

Figure 1B:
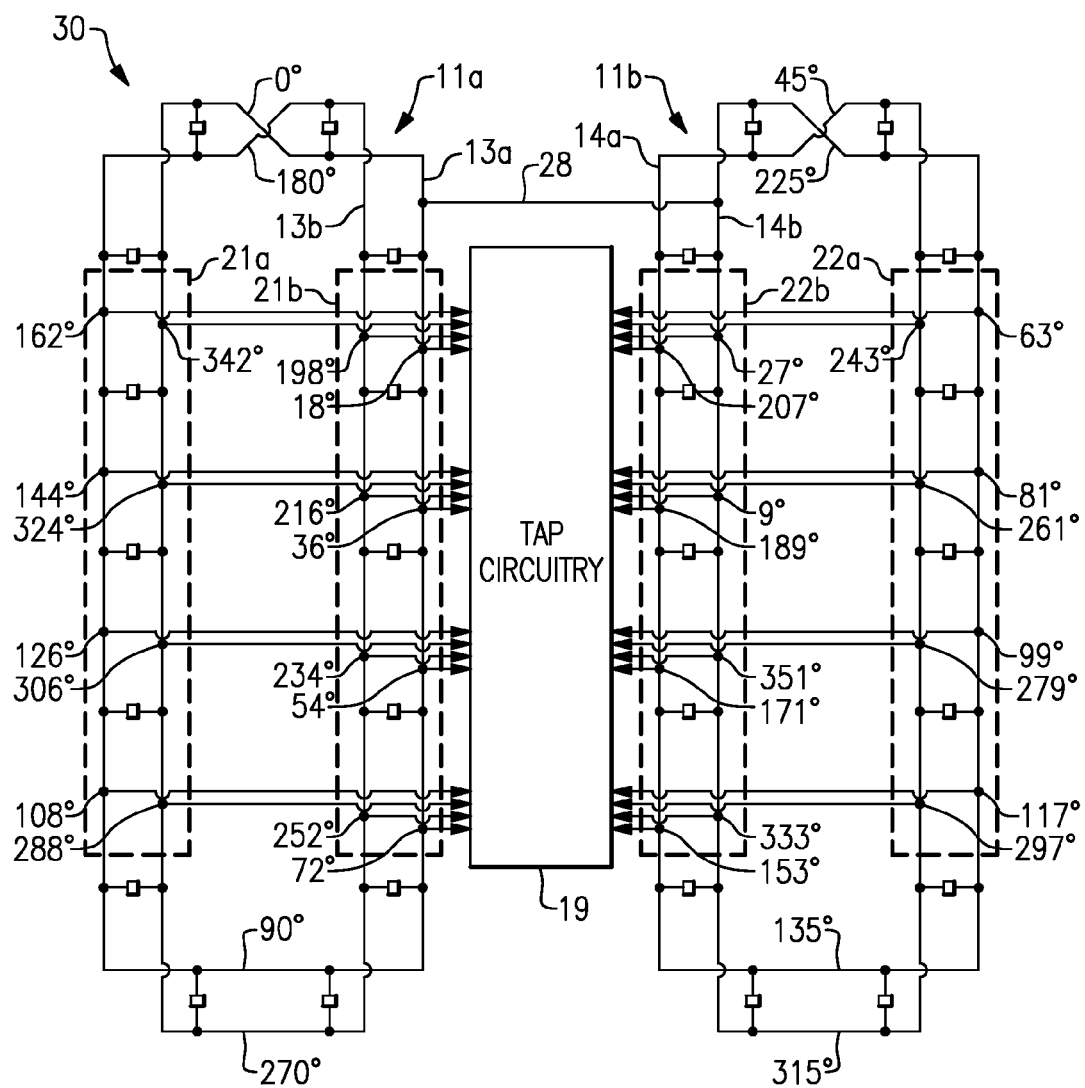
FIG. 1B is a schematic diagram of another embodiment of an RTWO system.

FIG. 1B is a schematic diagram of another embodiment of an RTWO system 30. The RTWO system 30 of FIG. 1B is similar to the RTWO system 10 FIG. 1A, except that the RTWO system 30 illustrates a specific implementation in which a phase-locking conductor 28 is used to phase-lock the second elongated RTWO 11b to the first elongated RTWO 11a with a 45° phase shift.

The illustrated RTWO system 30 has been annotated to include phases of various clock signal phases along the transmission lines of the first and second elongated RTWOs 11a, 11b. Although one example of clock signal phases is shown in FIG. 1B, other clock signal phases are possible, including, for example, clock signal phases associated with a particular RTWO system implementation.

As shown in FIG. 1B, the tap circuitry 19 receives clock signal phases of 108°, 126°, 144°, 162°, 288°, 306°, 324°, and 342° from the first elongated section 21a of the first elongated RTWO 11a. Additionally, the tap circuitry 19 receives clock signal phases of 18°, 36°, 54°, 72°, 198°, 216°, 234°, and 252° from the second elongated section 21b of the first elongated RTWO 11b. Furthermore, the tap circuitry 19 receives clock signal phases of 63°, 81°, 99°, 117°, 243°, 261°, 279°, and 297° from the first elongated section 22a of the second elongated RTWO 11b. Additionally, the tap circuitry 19 receives clock signal phases of 9°, 27°, 153°, 171°, 189°, 207°, 333°, and 353° from the second elongated section 22b of the second elongated RTWO 11b.

Accordingly, in the illustrated embodiment, the tap circuitry 19 receives clock signal phases of 9°, 18°, 27°, 36°, 54°, 63°, 72°, 81°, 99°, 108°, 117°, 126°, 144°, 153°, 162°, 171°, 189°, 198°, 207°, 216°, 234°, 243°, 252°, 261°, 279°, 288°, 297°, 306°, 324°, 333°, 342°, and 353° from elongated sections of the first and second elongated RTWOs 11a, 11b.

Thus, the elongated sections provide clock signal phases across the full 360° range. The taps exhibit excellent linearity, since the elongated sections include substantially straight sections of transmission line, and thus avoid the curves, corners, and/or cross-overs associated with poor phase linearity performance.

In the illustrated implementation, the largest phase separation between clock signal phases of adjacent taps is about 18°. However, additional taps can be provided to reduce the largest phase separation. For example, in one embodiment, the largest phase separation between clock signal phases of adjacent taps is less than about 0.35°.

Additional details of the RTWO system 30 can be as described earlier.

Figure 2:
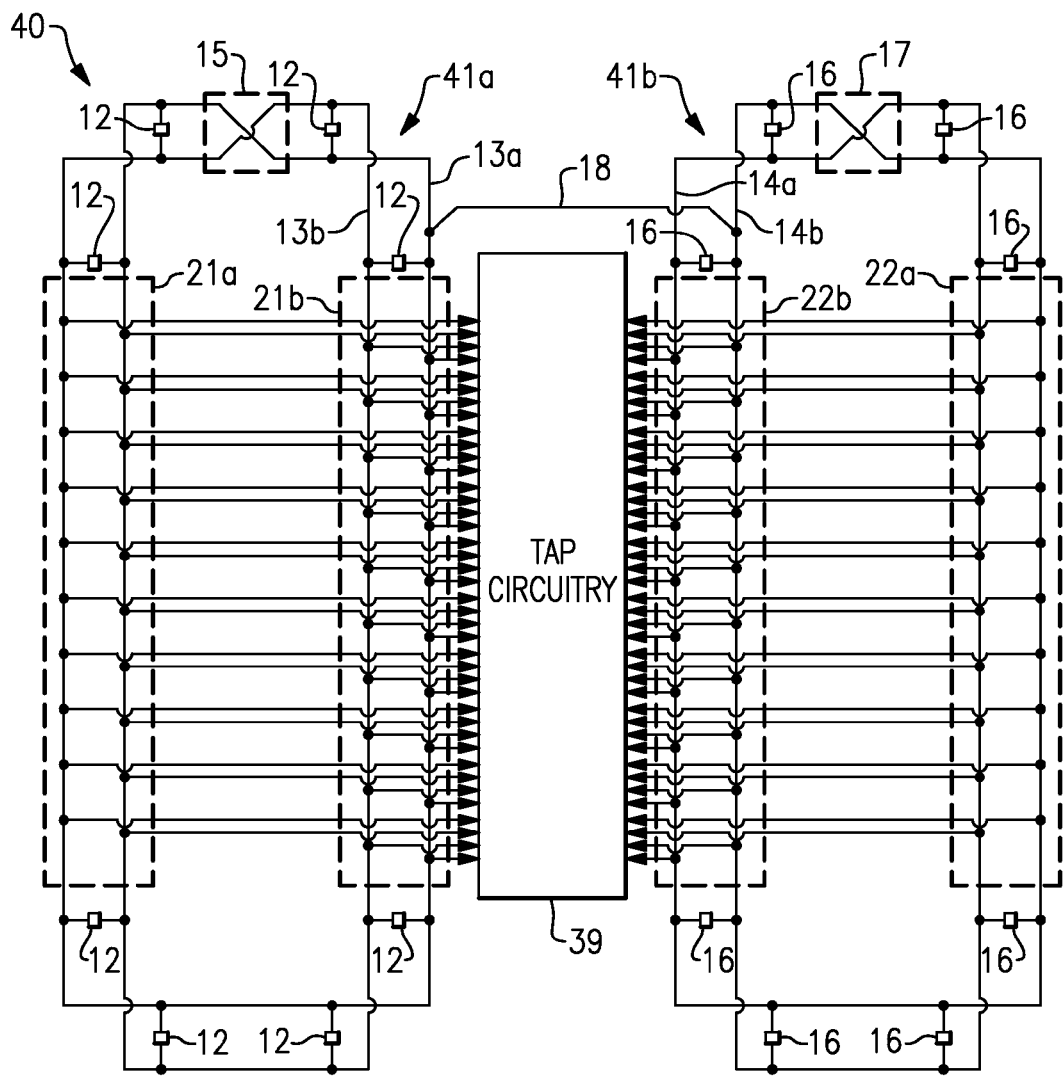
FIG. 2 is a schematic diagram of another embodiment of an RTWO system.

FIG. 2 is a schematic diagram of another embodiment of an RTWO system 40. The RTWO system 40 includes a first elongated RTWO 41a, a second elongated RTWO 41b, and tap circuitry 39 that receives clock signal phases from both the first elongated RTWO 41a and from the second elongated RTWO 41b.

The RTWO system 40 of FIG. 2 is similar to the RTWO system 10 of FIG. 1A, except that the RTWO system 40 of FIG. 2 includes a configuration in which the tap circuitry 39 receives a greater number of clock signal phases from the first and second elongated RTWOs 41a, 41b relative to the configuration shown in FIG. 1A. In particular, in the illustrated embodiment, the tap circuitry 39 receives 80 total clock signal phases from the first and second elongated RTWOs 41a, 41b.

Although FIG. 2 illustrates a configuration in which tap circuitry receives 80 clock signal phases, tap circuitry can receive more or fewer clock signals phases. In one embodiment, tap circuitry receives about 1024 clock signal phases.

The number of taps of an RTWO system can be important in a variety of applications. For instance, in frequency synthesizer applications, a number of available frequencies for synthesis depends on a number of available RTWO phases, and thus on the density of the RTWO's taps. Additionally, in ADC applications, the resolution of the ADC depends on the RTWO tap density.

In certain implementations, additional taps can be added to the RTWO system 40 by tapping the differential transmission lines of the first and second elongated RTWOs 41a, 41b in a greater number of positions. Although tapping the transmission lines in additional locations can increase tap density, such an approach can be limited by a variety of constraints, including, for example, available layout resources. For instance, a number of available metal routes can limit the maximum number of taps that an RTWO can provide. In certain embodiments herein, an RTWO system can employ phase interpolation to increase a number of available clock signal phases beyond those obtained by tapping transmission lines.

For clarity of the figures, FIG. 2 omits illustrating regeneration circuits in the elongated sections 21a, 21b of the first elongated RTWO 41a and in the elongated sections 22a, 22b of the second elongated RTWO 41b. However, the elongated sections of the first and second elongated RTWOs 41a, 41b can include regeneration circuits.

Additional details of the RTWO system 40 can be as described earlier.

Figure 3:
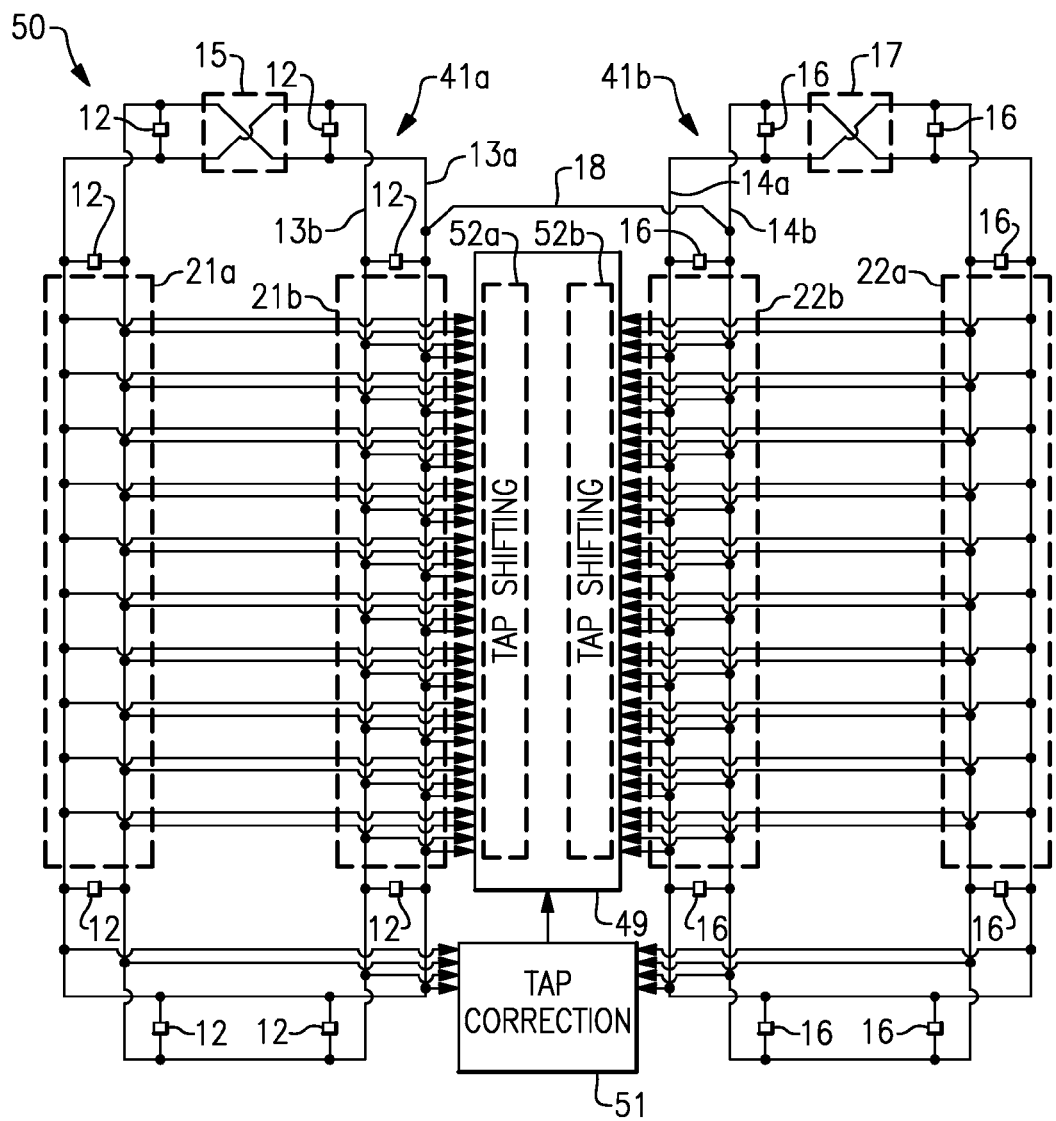
FIG. 3 is a schematic diagram of another embodiment of an RTWO system.

FIG. 3 is a schematic diagram of another embodiment of an RTWO system 50. The RTWO system 50 includes the first elongated RTWO 41a and the second elongated RTWO 41b, which can be as described earlier. The RTWO system 50 further includes tap circuitry 49 and a tap correction circuit 51.

The tap circuitry 49 includes a first tap shifting circuit 52a and a second tap shifting circuit 52b. The first and second tap shifting circuits 52a, 52b can be used to shift or adjust the taps of the first and second elongated RTWOs 41a, 41b, respectively, to compensate for a phase-locking error of the first and second elongated RTWOs 41a, 41b. For instance, the first and second elongated RTWOs 41a, 41b may have been designed to lock with a phase shift θ, but the elongated RTWOs 41a, 41b may lock with a phase shift θ+Δθ, where Δθ is the phase-locking error or phase mismatch. The phase mismatch can arise from a variety of sources, such as manufacturing errors, and can vary with operating conditions, including temperature and/or voltage.

The first and second tap shifting circuits 52a, 52b aid in correcting for a phase mismatch between the first and second elongated RTWOs 41a, 41b relative to a desired phase shift, thereby aiding the tap circuitry in combining the clock signal phases from the first elongated RTWO 41a and the clock signal phases from the second elongated RTWO 41b to generate output clock signal phases.

Although FIG. 3 illustrates a configuration in which the tap circuitry 49 includes two tap shifting circuits, other configurations are possible, including, for example, implementations including a single tap shifting circuit. Furthermore, tap correction circuitry can be placed in other locations. In certain configurations, an RTWO system includes two or more tap correction circuits.

The tap correction circuit 51 generates a tap shifting control signal that is used to control tap shifting of the first and second tap shifting circuits 49. The tap correction circuit 51 receives at least one clock signal phase from the first elongated RTWO 41a and at least one clock signal phase from the second elongated RTWO 41b, and generates the tap shifting control signal based on a comparison of the clock signal phases. In one embodiment, a tap shifting circuit is used to shift a tap by a discrete number of tap positions.

As shown in FIG. 3, the tap correction circuit 51 receives clock signal phases from the first and second elongated RTWOs 41a, 41b. However, in contrast to the tap circuitry 49 that receives clock signal phases from the elongated sections 21a, 21b of the first elongated RTWO 41a and from the elongated sections 22a, 22b of the second elongated RTWO 41b, the illustrated tap correction circuit 51 receives clock signal phases generated outside the elongated sections.

Configuring the RTWO system 50 in this manner increases the linearity of the elongated sections 50 relative to a configuration in which a tap correction circuit operates as a non-uniform load to the RTWOs' elongated sections. Moreover, implementing the tap correction circuit 51 near corners of the RTWOs 41a, 41b avoids using layout resources near the elongated sections of the first and second elongated RTWOs 41a, 41b. Accordingly, the illustrated configuration provides the benefits of both tap correction and high tap density.

Additional details of the RTWO system 50 can be as described earlier.

Figure 4A:
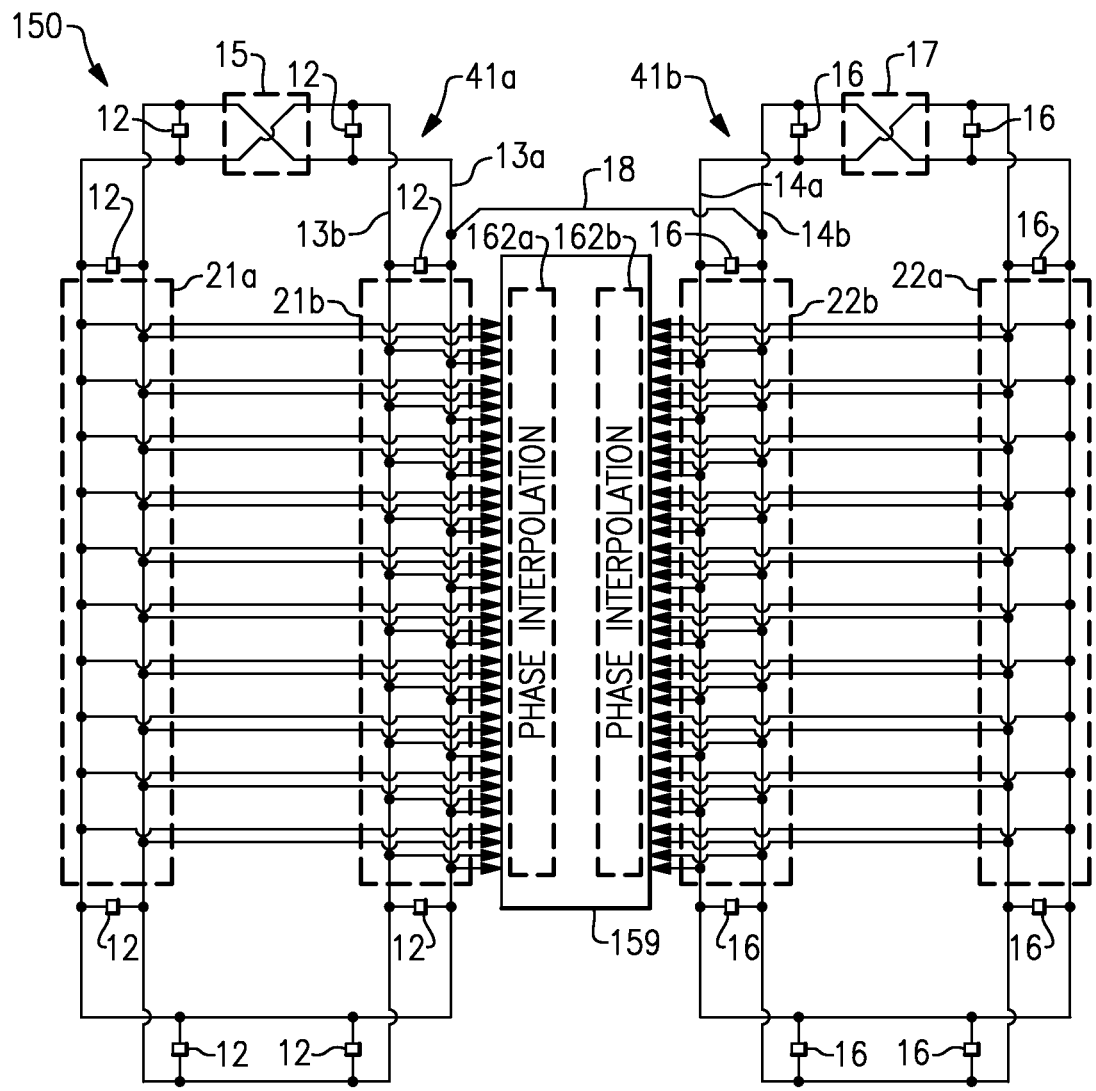
FIG. 4A is a schematic diagram of another embodiment of an RTWO system.

FIG. 4A is a schematic diagram of another embodiment of an RTWO system 150. The RTWO system 150 includes the first elongated RTWO 41a and the second elongated RTWO 41b, which can be as described earlier. The RTWO system 150 further includes tap circuitry 159.

The tap circuitry 159 includes a first phase interpolation circuit 162a and a second phase interpolation circuit 162b. The first phase interpolation circuit 162a interpolates between the clock signal phases provided by the first elongated RTWO 41a to generate additional clock signal phases. Additionally, the second phase interpolation circuit 162b interpolates between the clock signal phases provide by the second elongated RTWO 41b to generate additional clock signal phases.

The number of taps of an RTWO system can be important in a variety of applications. For instance, in frequency synthesizer applications, a number of available frequencies for synthesis depends on a number of available RTWO phases, and thus on the density of the RTWO's taps. Additionally, in ADC applications, the resolution of the ADC depends on the RTWO tap density.

Although a transmission line can be tapped in additional locations to increase tap density, such an approach can be limited by a variety of constraints, including, for example, available layout resources.

In the illustrated embodiment, the first phase interpolation circuit 162a generates additional clock signal phases by mixing proportions of adjacent taps of the first elongated RTWO 41a, and the second phase interpolation circuit 162b generates additional clock signal phases by mixing proportions of adjacent taps of the second elongated RTWO 41b. However, other configurations are possible. For example, in another embodiment, phase circuitry includes a common or shared phase interpolation circuit that interpolates clock signal phases from two or more RTWOs.

In one embodiment, the RTWO system 150 has a tap density of at least about 5.625 degrees/tap.

Additional details of the RTWO system 150 can be as described earlier.

Figure 4B:
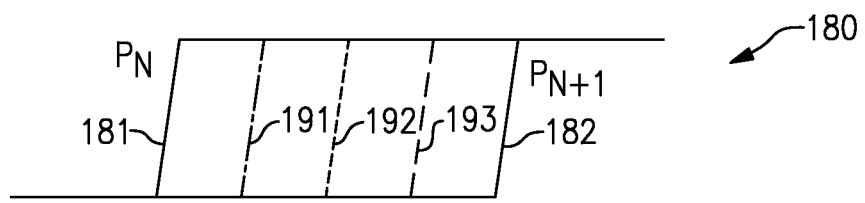
FIG. 4B is a schematic diagram of one example of interpolated clock signals for an RTWO system.

FIG. 4B is a schematic diagram 180 of one example of interpolated clock signals for an RTWO system, such as the RTWO system 150 of FIG. 4A.

The diagram 180 includes a first clock signal phase 181 and a second clock signal phase 182, which correspond to clock signal phases from two taps that are adjacent in phase. As shown in FIG. 4B, a phase interpolation circuit interpolates the first and second clock signal phases 181, 182 to generate interpolated clock signal phases 191-193. The phase interpolation circuit can provide both the first and second clock signal phases 181, 182 and the interpolated clock signal phase 191-193 as outputs.

Accordingly, one or more phase interpolation circuits can be included in tap circuitry to increase the number of available clock signal phases. Although FIG. 4B illustrates an example in which three interpolated clock signal phases are generated by interpolation, other configurations are possible. In one embodiment, a phase interpolation circuit generates between 1 and 64 interpolated clock signals between adjacent taps.

In certain configurations, the first clock signal phase 181 and the second clock signal phase 182 are generated by the same RTWO. For instance, with reference to the RTWO system 30 of FIG. 1B, in one example the first clock signal phase 181 corresponds to the 18° phase from the first elongated RTWO 11a and the second clock signal phase 182 corresponds to the 36° phase from the first elongated RTWO 11a. In other configurations, the first clock signal phase 181 and the second clock signal phase 182 are generated by different RTWOs. For instance, with reference to the RTWO system 30 of FIG. 1B, in another example the first clock signal phase 181 corresponds to the 18° phase from the first elongated RTWO 11a and the second clock signal phase 182 correspond to the 27° phase from the second elongated RTWO 11b.

Figure 5:
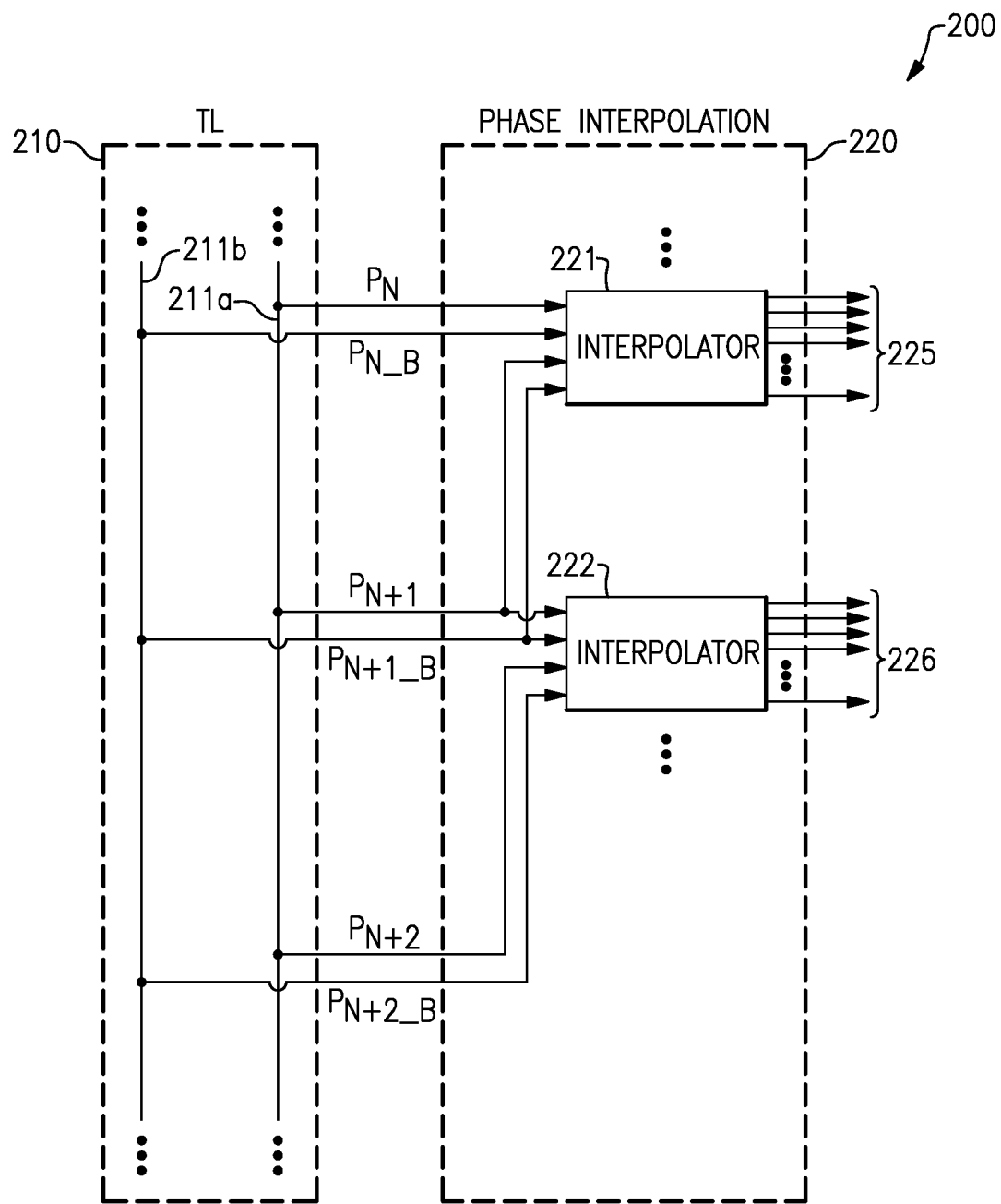
FIG. 5 is a schematic diagram of one embodiment of a phase interpolation system.

FIG. 5 is a schematic diagram of one embodiment of a phase interpolation system 200. The phase interpolation system 200 includes a differential transmission line 210 and a phase interpolation circuit 220.

The differential transmission line 210 includes a first conductor 211a and a second conductor 211b. As shown in FIG. 5, the first and second conductors 211a, 211b are substantially parallel to one another and extend in a first direction (vertically in FIG. 5). As shown in FIG. 5, the first conductor 211a has been tapped in three positions to generate a $P_N$ clock signal phase, a $P_{N+1}$ clock signal phase, and a $P_{N+2}$ clock signal phase. Additionally, the second conductor 211b has been tapped in three positions to generate a $P_{N\_B}$ clock signal phase, a $P_{N+1\_B}$ clock signal phase, and a $P_{N+2\_B}$ clock signal phase. The $P_{N\_B}$, $P_{N+1\_B}$, and $P_{N+2\_B}$ clock signal phases are inverted or about 180° out of phase relative to the $P_N$, $P_{N+1}$, and $P_{N+2}$ clock signal phases, respectively. In one embodiment, the differential transmission line 210 is a differential transmission line of an RTWO.

The phase interpolation circuit 220 includes a first phase interpolator 221 and a second phase interpolator 222. The first phase interpolator 221 receives the $P_N$, $P_{N\_B}$, $P_{N+1}$ and $P_{N+1\_B}$ clock signal phases, and generates a first group of output clock signal phases 225. In certain implementations, each of the output clock signal phases 225 generated by the first interpolator 221 are interpolated clock signal phases. In other implementations, the clock signal phases 225 include not only interpolated clock signal phases, but also at least one of the $P_N$, $P_{N\_B}$, $P_{N+1}$ or $P_{N+1\_B}$ clock signal phases. Similarly, the second phase interpolator 222 receives the $P_{N+1}$, $P_{N+1\_B}$, $P_{N+2}$ and $P_{N+2\_B}$ clock signal phases, and generates a second group of output clock signal phases 226.

The first and second phase interpolators 221, 222 provide phase interpolation to increase the number of available clock signal phases. In particular, the phase interpolators 221, 222 provide phase interpolation to provide a greater number of clock signal phases relative to the clock signal phases provided by tapping the differential transmission line 210.

Although FIG. 5 illustrates a configuration including two phase interpolators that receive clock signal phases based on tapping the first conductor 211a in three positions and the second conductor 211b in three positions, other configurations are possible. For example, in one embodiment, an interpolation system includes between about 64 and about 1024 phase interpolators.

Although FIG. 5 illustrates a configuration in which a phase interpolator receives clock signal phases from both conductors of the differential transmission line 210, other configurations are possible, such as implementations in which a phase interpolator receives clock signal phases from a single conductor. Moreover, the teachings herein are also applicable to configurations in which phase interpolators provide interpolation between clock signal phases generated by two or more different transmission lines.

In certain configurations, the phase interpolation circuit 220 includes phase interpolators 221, 222 that operate as capacitive loads to the differential transmission line 210. Additionally, the phase interpolators 221, 222 operate as part of the distributed capacitance of the differential transmission line 210.

Implementing the phase interpolators 221, 222 as capacitive loads to a transmission line decreases power consumption. For example, although the phase interpolators 221, 222 have an input capacitance, the interpolators operate without corresponding $CV^2f$ power loss, since the input capacitance operates as part of the characteristic impedance of the transmission line 210. In contrast, a phase interpolator using resistive loads, such as a resistor ladder, consumes $CV^2f$ power.

In certain configurations, the clock signal phases provided to the phase interpolators 221, 222 have a trapezoidal wavefront. In one example, edge rates of 30 GV/s are achieved.

Additional details of the phase interpolation system 200 can be as described earlier.

Figure 6A:
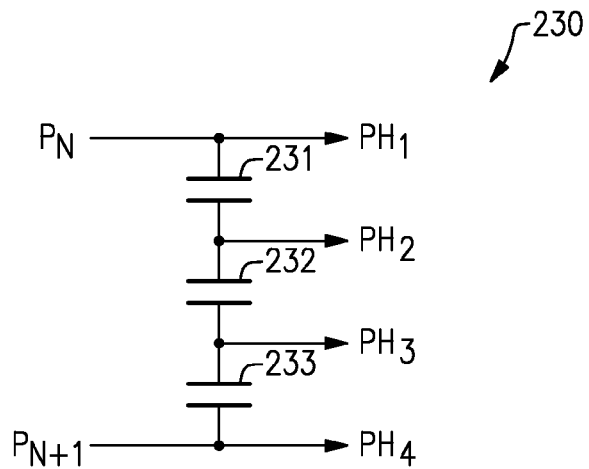
FIG. 6A is a circuit diagram of one embodiment of a phase interpolator.

FIG. 6A is a circuit diagram of one embodiment of a phase interpolator 230. The phase interpolator 230 includes a first capacitor 231, a second capacitor 232, and a third capacitor 233. The phase interpolator 230 receives a $P_N$ input clock signal phase and a $P_{N+1}$ input clock signal phase and generates $PH_1$, $PH_2$, $PH_3$, and $PH_4$ output clock signal phases.

The first capacitor 231, the second capacitor 232, and the third capacitor 233 are electrically connected in series between a first node and a second node. As shown in FIG. 6A, the first node is used both to receive the $P_N$ input clock signal phase and to generate the $PH_1$ output clock signal phase. Additionally, the second node is used to both receive the $P_{N+1}$ input clock signal phase and to generate the $PH_4$ output clock signal phase. The $PH_2$ output clock signal phase is generated at a first intermediate node between the first and second capacitors 231, 232, and the $PH_3$ output clock signal phase is generated at a second intermediate node between the second and third capacitors 232, 233.

Although FIG. 6A illustrates a configuration of a phase interpolator that receives two clock signal phases and generates four clock signal phases, other configurations are possible. For example, the phase interpolator 230 can include more or fewer capacitors in series to generate a desired number of output clock signal phases.

The phase interpolator 230 illustrates one example of a phase interpolator that operates as a capacitive load to a transmission line, and thus reduces or eliminates $CV^2f$ power loss.

Additional details of the phase interpolator 230 can be as described earlier.

Figure 6B:
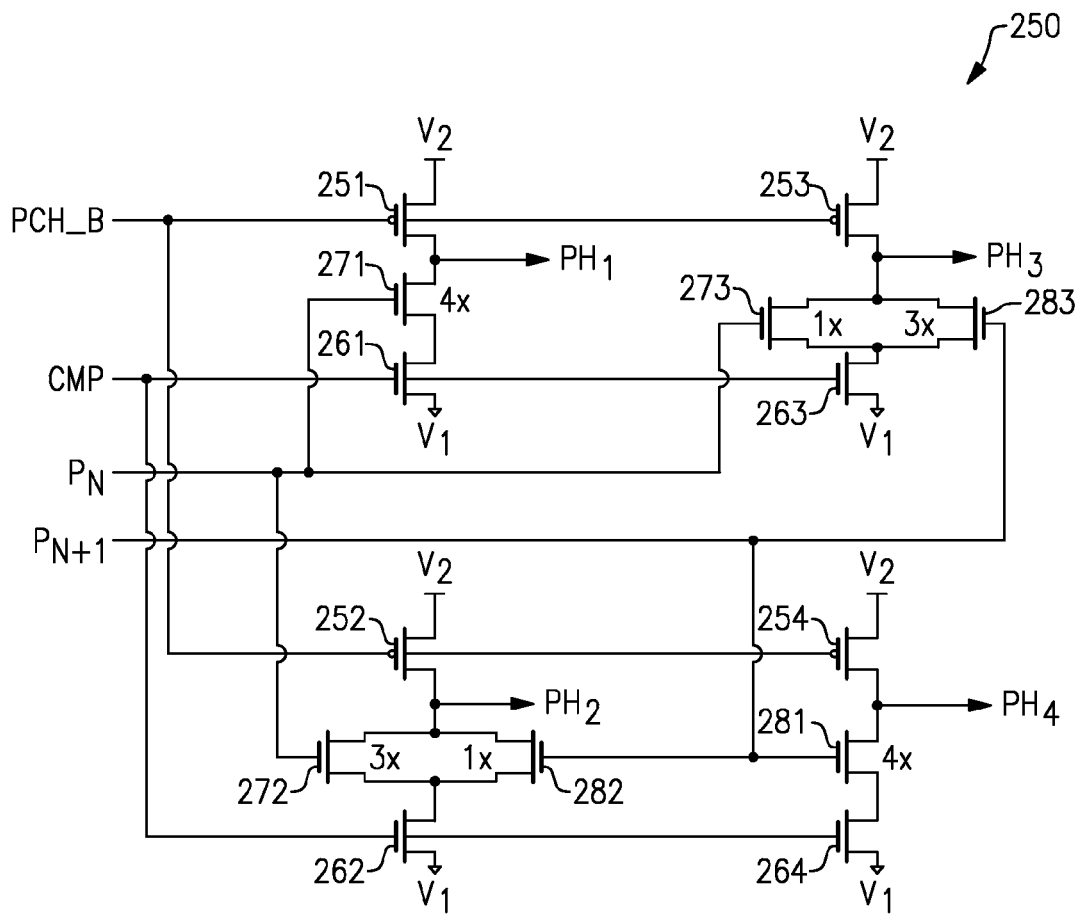
FIG. 6B is a circuit diagram of another embodiment of a phase interpolator.

FIG. 6B is a circuit diagram of another embodiment of a phase interpolator 250. The phase interpolator 250 includes first to fourth precharge p-type field effect transistors (PFETs) 251-254 and first to fourth comparator n-type field effect transistors (NFETs) 261-264. Additionally, the phase interpolator 250 includes a first group of ratioed NFETs 271-273 and a second group of ratioed NFETs 281-283. The phase interpolator 250 receives a $P_N$ input clock signal phase and a $P_{N+1}$ input clock signal phase and generates $PH_1$, $PH_2$, $PH_3$, and $PH_4$ output clock signal phases.

As shown in FIG. 6B, the gates of the precharge PFETs 251-254 receive an inverted precharge signal PCH_B, which is used to precharge the $PH_1$, $PH_2$, $PH_3$, and $PH_4$ output clock signal phases to a voltage level $V_2$. Additionally, the gates of the precharge NFETs 261-264 receive a comparator signal CMP, which can be activated before a rising edge of the $P_N$ and $P_{N+1}$ input clock signal phases is received. In one embodiment, an RTWO that includes the phase interpolator 250 is used as a counter, and the comparator signal CMP is used to start and stop counting.

As shown in FIG. 6B, various combinations of the first group of ratioed NFETs 271-273 and the second group of ratioed NFETs 281-283 are used to control timing of a falling edge of the $PH_1$, $PH_2$, $PH_3$, and $PH_4$ output clock signal phases to a voltage level $V_1$. The first group of ratioed NFETs 271-273 include gates that receive the $P_N$ input clock signal, and the second group of ratioed NFETs 281-283 include gates that receive the $P_{N+1}$ input clock signal. By including a combination of FETs of different sizes or weights, an interpolated clock signal of a desired phase can be generated.

For example, in the illustrated configuration, the $PH_1$ output clock signal phase is generated using the NFET 271, which has a 4× weight in this example relative to a unit transistor of 1× size. Excluding a propagation delay through the phase interpolator 250, the $PH_1$ output clock signal phase can have a phase that is about equal to that of the $P_N$ input clock signal. Additionally, the $PH_2$ output clock signal phase is generated using the parallel combination of the NFET 272 and the NEFT 282, which have 3× and 1× weights, respectively, in this example. Excluding propagation delay, the $PH_2$ output clock signal phase can have a phase that is about one-quarter of the way between the phases of the $P_N$ and $P_{N+1}$ input clock signals. Furthermore, the $PH_3$ output clock signal phase is generated using the parallel combination of the NFET 273 and the NEFT 283, which have 1× and 3× weights, respectively, in this example. Excluding propagation delay, the $PH_3$ output clock signal phase can have a phase that is about three-quarters of the way between the phases of the $P_N$ and $P_{N+1}$ input clock signals. Additionally, the $PH_4$ output clock signal phase is generated using the NFET 281, which has a 4× weight in this example. Excluding propagation delay, the $PH_4$ output clock signal phase can have a phase that is about equal to that of the $P_{N+1}$ input clock signal.

Although one example of ratioed FETs has been provided, other configurations are possible. For example, a phase interpolator can include combinations of ratioed FETs to generate interpolated clock signal phases of desired phases. Moreover, the teachings herein are applicable to configurations using ratioed NFETs, ratioed PFETs, or a combination thereof.

The phase interpolator 250 illustrates another example of a phase interpolator that operates as a capacitive load to a transmission line, and thus reduces or eliminates $CV^2 f$ power loss.

Additional details of the phase interpolator 250 can be as described earlier.

Figure 6C:
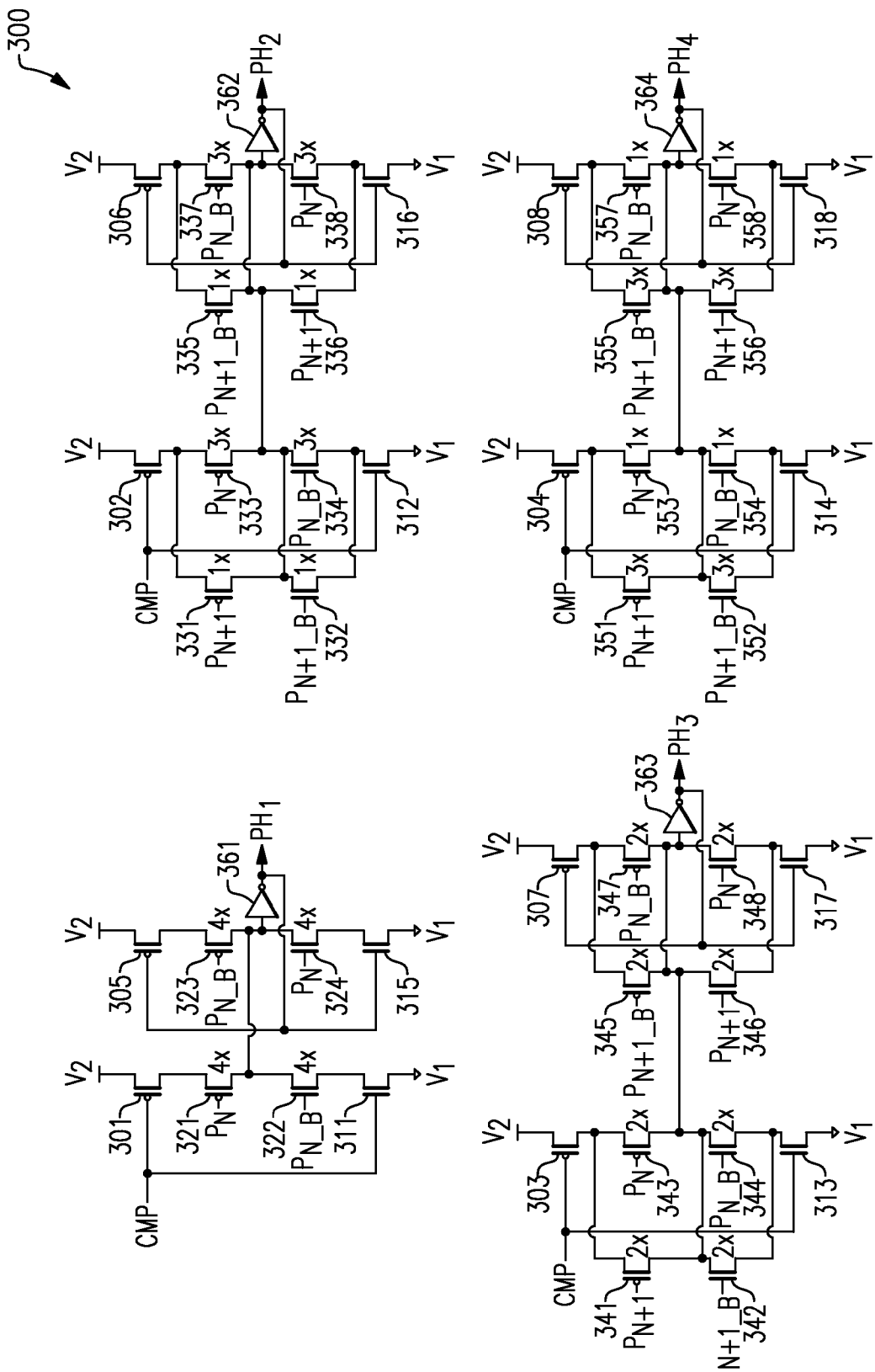
FIG. 6C is a circuit diagram of another embodiment of a phase interpolator.

FIG. 6C is a circuit diagram of another embodiment of a phase interpolator 300. The phase interpolator 300 includes comparator PFETs 301-304, feedback PFETs 305-308, comparator NFETs 311-314, feedback NFETs 315-318, and inverters 361-364. Additionally, the phase interpolator 300 includes a first group of ratioed FETs 321-324, a second group of ratioed FETs 331-338, a third group of ratioed FETs 341-348, and a fourth group of ratioed FETs 351-358. The phase interpolator 300 receives a $P_N$ input clock signal phase, a $P_{N\_B}$ input clock signal phase, a $P_{N+1}$ input clock signal phase, and a $P_{N+1\_B}$ input clock signal phase and generates $PH_1$, $PH_2$, $PH_3$, and $PH_4$ output clock signal phases.

As shown in FIG. 6C, the gates of the comparator PFETs 301-304 and the gates of the comparator NFETs 311-314 receive a comparator signal CMP. In one embodiment, an RTWO that includes the phase interpolator 300 is used as a counter, and the comparator signal CMP is used to start and stop counting.

As shown in FIG. 6C, the first to fourth inverters 361-364 generate the $PH_1$, $PH_2$, $PH_3$, and $PH_4$ output clock signal phases, respectively. Additionally, the inverters 361-364 provide feedback to the gates of the feedback PFETs 305-308 and the gates of the feedback NFETs 315-318. Providing feedback allows the output clock signal phases to control timing of precharge operations, thereby avoiding a need for a global precharge signal.

The first group of ratioed FETs 321-324 is used to control timing of the $PH_1$ output clock signal phase. As shown in FIG. 6C, the first group of ratioed FETs 321-324 includes a PFET 321 and an NFET 322 that operate in a first stage and a PFET 323 and an NFET 324 that operate in a second stage. The PFET 321 and the NFET 324 receive the $P_N$ input clock signal phase and have a 4× weight, and the NFET 322 and the NFET 323 receive the $P_{N\_B}$ input clock signal phase and have a 4× weight. Excluding a propagation delay through the phase interpolator 300, the $PH_1$ output clock signal phase can have a phase that is about equal to that of the $P_N$ input clock signal.

The second group of ratioed FETs 331-338 is used to control timing of the $PH_2$ output clock signal phase. The second group of ratioed FETs 331-338 includes a PFET 331 of 1× weight, an NFET 332 of 1× weight, a PFET 333 of 3× weight, and an NFET 334 of 3× weight that operate in a first stage. Additionally, the second group of ratioed FETs 331-338 includes a PFET 335 of 1× weight, an NFET 336 of 1× weight, a PFET 337 of 3× weight, and an NFET 338 of 3× weight that operate in a second stage. The PFET 333 and the NFET 338 receive the $P_N$ input clock signal phase, the NFET 334 and the PFET 337 receive the $P_{N\_B}$ input clock signal phase, the PFET 331 and the NFET 336 receive the $P_{N+1}$ input clock signal phase, and the NFET 332 and the PFET 335 receive the $P_{N+1\_B}$ input clock signal phase. Excluding propagation delay, the $PH_2$ output clock signal phase can have a phase that is about one-quarter of the way between the phases of the $P_N$ and $P_{N+1}$ input clock signals.

The third group of ratioed FETs 341-348 is used to control timing of the $PH_3$ output clock signal phase. The third group of ratioed FETs 341-348 includes a PFET 341 of 2× weight, an NFET 342 of 2× weight, a PFET 343 of 2× weight, and an NFET 344 of 2× weight that operate in a first stage. Additionally, the third group of ratioed FETs 341-348 includes a PFET 345 of 2× weight, an NFET 346 of 2× weight, a PFET 347 of 2× weight, and an NFET 348 of 2× weight that operate in a second stage. The PFET 343 and the NFET 348 receive the $P_N$ input clock signal phase, the NFET 344 and the PFET 347 receive the $P_{N\_B}$ input clock signal phase, the PFET 341 and the NFET 346 receive the $P_{N+1}$ input clock signal phase, and the NFET 342 and the PFET 345 receive the $P_{N+1\_B}$ input clock signal phase. Excluding propagation delay, the $PH_3$ output clock signal phase can have a phase that is about half of the way between the phases of the $P_N$ and $P_{N+1}$ input clock signals.

The fourth group of ratioed FETs 351-358 is used to control timing of the $PH_4$ output clock signal phase. The fourth group of ratioed FETs 351-358 includes a PFET 351 of 3× weight, an NFET 352 of 3× weight, a PFET 353 of 1× weight, and an NFET 354 of 1× weight that operate in a first stage. Additionally, the fourth group of ratioed FETs 351-358 includes a PFET 355 of 3× weight, an NFET 356 of 3× weight, a PFET 357 of 1× weight, and an NFET 358 of 1× weight that operate in a second stage. The PFET 353 and the NFET 358 receive the $P_N$ input clock signal phase, the NFET 354 and the PFET 357 receive the $P_{N\_B}$ input clock signal phase, the PFET 351 and the NFET 356 receive the $P_{N+1}$ input clock signal phase, and the NFET 352 and the PFET 355 receive the $P_{N+1\_B}$ input clock signal phase. Excluding propagation delay, the $PH_4$ output clock signal phase can have a phase that is about three-quarters of the way between the phases of the $P_N$ and $P_{N+1}$ input clock signals.

Although one example of ratioed FETs has been provided, other configurations are possible. For example, a phase interpolator can include combinations of ratioed FETs to generate interpolated clock signal phases of desired phases.

The phase interpolator 300 illustrates another example of a phase interpolator that operates as a capacitive load to a transmission line, and thus reduces or eliminates $CV^2f$ power loss.

Additional details of the phase interpolator 300 can be as described earlier.

Figure 7:
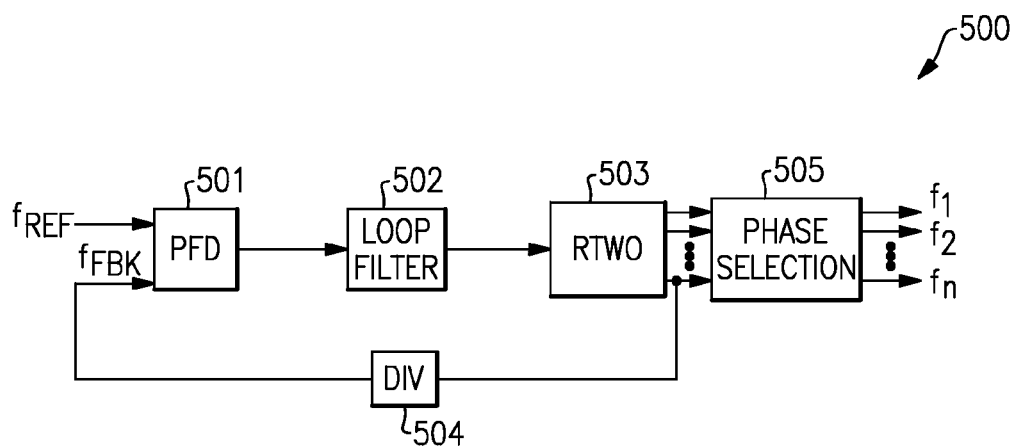
FIG. 7 is a schematic diagram of a frequency synthesizer including an RTWO system according to one embodiment.

FIG. 7 is a schematic diagram of a frequency synthesizer 500 including an RTWO system according to one embodiment. The frequency synthesizer 100 includes a phase-frequency detector (PFD) 501, a loop filter 502, an RTWO system 503, a feedback divider 504, and a phase selection circuit 505. The frequency synthesizer 500 receives a reference clock signal $f_{REF}$ and generates a plurality of synthesized clock signals $f_1, f_2, \ldots f_n$, which can have different frequencies and/or phases from one another.

The frequency synthesizer 500 illustrates one example of an electronic system that can include an RTWO system implemented in accordance with the teachings herein. However, the RTWO systems herein can be used in other configurations of electronic systems.

As shown in FIG. 7, the PFD 501 generates an error signal based on comparing the reference clock signal $f_{REF}$ to a feedback clock signal $f_{FBK}$ generated by the feedback divider 504. The loop filter 502 generates a filtered error signal based on filtering the error signal from the PFD 501. The loop filter 502 controls an oscillation frequency of the RTWO system 503 using the filtered error signal. The loop filter 502 can control the oscillation frequency of the RTWO system 503 in a variety of ways, including, for example, by controlling the capacitance of shunt capacitors of the RTWO system's transmission lines.

The RTWO system 503 includes tap circuitry (not illustrated in FIG. 7) that generates a plurality of clock signal phases for the phase selection circuit 505. The phase selection circuit 505 generates n synthesized output clock signals $f_1, f_2, \ldots f_n$ using digital selection techniques. As shown in FIG. 7, one or more of the clock signal phases from the RTWO system 503 can be provided to the feedback divider 504, which generates the feedback clock signal $f_{FBK}$ of divided frequency.

The illustrated frequency synthesizer 500 is implemented as a Doppler synthesizer, which can exhibit spurious output frequencies when the clock signal phases received by the phase selection circuit 505 have poor linearity. Additionally, a phase separation between the clock signal phases provides a fundamental limit on the synthesizer's RMS output jitter.

By implementing the RTWO system 503 in accordance with the teachings herein, the phase selection circuit 505 can be provided with a relatively large number of clock signal phases of relatively high phase linearity. Thus, the frequency synthesizer 500 can operate with relatively small clock jitter and/or output spurs.

Additional details of the frequency synthesizer 500 can be as described earlier.

Figure 8:
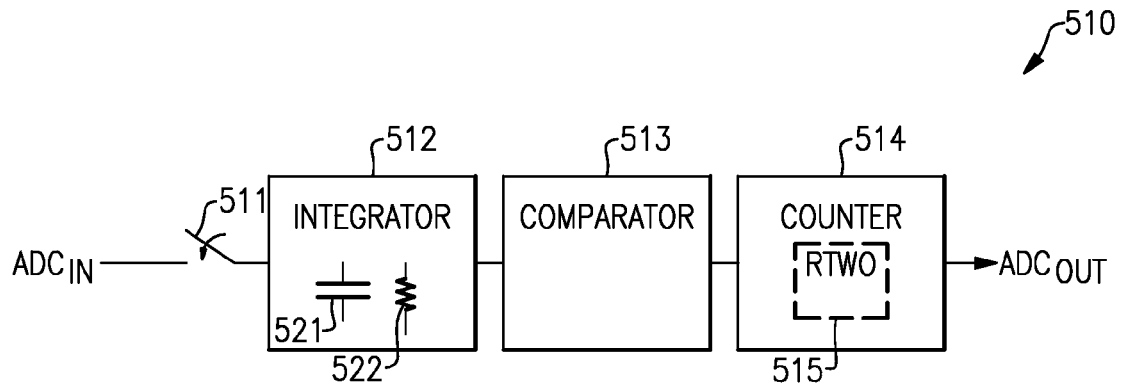
FIG. 8 is a schematic diagram of an analog-to-digital converter (ADC) including an RTWO system according to one embodiment.

FIG. 8 is a schematic diagram of an analog-to-digital converter (ADC) 510 including an RTWO system according to one embodiment. The ADC 510 includes an input switch 511, an integrator 512, a comparator 513, and a counter 514 that include an RTWO system 515. The ADC 510 receives an analog input signal at an input $ADC_{IN}$ and generates a digital output signal at an output $ADC_{OUT}$.

The ADC 510 illustrates one example of an electronic system that can include an RTWO system implemented in accordance with the teachings herein. However, the RTWO systems herein can be used in other configurations of electronic systems.

The switch 511 is used to selectively couple the input $ADC_{IN}$ to the integrator 512. The integrator 512 includes an integration capacitor 521 and a resistor 522, and can be used to integrate an analog input voltage received on the input $ADC_{IN}$.

The ADC 510 can be implemented in a wide variety of configurations, including for example, as a single-slope ADC or a dual-slope ADC.

In certain configurations, the ADC 510 an input voltage received on the input $ADC_{IN}$ is integrated using the integrator 512, and the integrator's output is compared to a known reference value using the comparator 513. Additionally, the counter 514 is used to measure an integration time and/or deintegration time of the integrator 512.

The illustrated counter 514 includes the RTWO 515. The accuracy of the counter 514 is based on the density of taps of the RTWO system 515. In particular, when the RTWO system 515 includes N evenly-spaced taps and oscillates with a period of $T_{OSC}$, the counter 514 can be used to count in time increments of $T_{OSC}/N$.

By implementing the RTWO system 515 in accordance with the teachings herein, the counter 514 can be provided with a relatively large number of clock signal phases of relatively high phase linearity. Thus, the ADC 510 can operate with relatively high linearity and/or resolution.

Additional details of the ADC 510 can be as described earlier.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
a rotary traveling wave oscillator (RTWO) system comprising:
  a first elongated RTWO comprising a first differential transmission line in a closed loop, wherein the first differential transmission line comprises one or more elongated sections that generate a first plurality of clock signal phases;
  a second elongated RTWO comprising a second differential transmission line in a closed loop, wherein the second differential transmission line comprises one or more elongated sections that generate a second plurality of clock signal phases, wherein the second elongated RTWO is phase-locked to the first elongated RTWO with a phase shift; and
  tap circuitry configured to receive the first plurality of clock signal phases from the first elongated RTWO and the second plurality of clock signal phases from the second elongated RTWO, wherein each of the one or more elongated sections of the first elongated RTWO provide the tap circuitry with more than 90° of clock signal phase, and wherein each of the one or more elongated sections of the second elongated RTWO provide the tap circuitry with more than 90° of clock signal phase, wherein the tap circuitry has a tap density of at least about 5.625 degrees/tap.

2. The apparatus of claim 1, wherein the tap circuitry further comprises a phase interpolation circuit configured to generate a plurality of interpolated clock signal phases based on interpolating between two or more clock signal phases received by the tap circuitry.

3. The apparatus of claim 2, wherein the phase interpolation circuit comprises a first interpolator comprising a plurality of capacitors electrically connected in series.

4. The apparatus of claim 2, wherein the phase interpolation circuit comprises a first interpolator comprising a plurality of ratioed field effect transistors (FETs).

5. The apparatus of claim 1, wherein the one or more elongated sections of the first and second elongated RTWOs do not include any curves, corners, or cross-overs.

6. The apparatus of claim 1, wherein the tap circuitry comprises one or more tap shifting circuits configured to compensate for a phase mismatch between the first elongated RTWO and the second elongated RTWO, wherein the RTWO system further comprises a tap correction circuit configured to control the one or more tap shifting circuits based on comparing one or more clock signals from the first elongated RTWO to one or more clock signal phases from the second elongated RTWO.

7. The apparatus of claim 6, wherein the one or more clock signal phases from the first elongated RTWO are provided from outside of the one or more elongated sections of the first differential transmission line, and wherein the one or more clock signal phases from the second elongated RTWO are provided from outside of the one or more elongated sections of the second differential transmission line.

8. The apparatus of claim 1, wherein the phase shift is selected to be in the range of about 35° and 55°.

9. The apparatus of claim 1, wherein the one or more elongated sections of the first elongated RTWO extend in a first direction, wherein the one or more elongated section of the first elongated RTWO each have a length in the range of about 90 μm to 900 μm.

10. An apparatus comprising:
a rotary traveling wave oscillator (RTWO) system comprising:
  a first elongated RTWO comprising a first differential transmission line in a closed loop, wherein the first differential transmission line comprises one or more elongated sections that generate a first plurality of clock signal phases;
  a second elongated RTWO comprising a second differential transmission line in a closed loop, wherein the second differential transmission line comprises one or more elongated sections that generate a second plurality of clock signal phases, wherein the second elongated RTWO is phase-locked to the first elongated RTWO with a phase shift; and
  tap circuitry configured to receive the first plurality of clock signal phases from the first elongated RTWO and the second plurality of clock signal phases from the second elongated RTWO, wherein the first elongated RTWO is elongated in a first direction, wherein the first elongated RTWO has a length in the first direction and a width in a second direction perpendicular to the first direction, wherein the length is greater than the width by a factor of 2 or more.

11. The apparatus of claim 1, wherein the one or more elongated sections of the first differential transmission line comprises a first elongated section on a first side of the first elongated RTWO and a second elongated section on a second side of the first elongated RTWO that is opposite the first side, and wherein the one or more elongated sections of the second differential transmission line comprises a first elongated section on a first side of the second elongated RTWO and a second elongated section on a second side of the second elongated RTWO opposite the first side.

12. The apparatus of claim 1, further comprising a phase-locking conductor configured to phase lock the second elongated RTWO to the first elongated RTWO.

13. The apparatus of claim 1, further comprising a frequency synthesizer comprising the RTWO system, wherein the frequency synthesizer generates one or more synthesized clock signals based on a plurality of output clock signal phases of the tap circuitry.

14. The apparatus of claim 1, further comprising an analog-to-digital converter (ADC) comprising the RTWO system, wherein timing of a counting operation of the ADC is controlled by a plurality of output clock signal phases of the tap circuitry.

15. A phase interpolation system comprising:
a transmission line; and
a phase interpolation circuit comprising:
  a plurality of phase interpolators comprising a first phase interpolator configured to receive a plurality of input clock signal phases, wherein the plurality of input clock signal phases comprises a first input clock signal phase taken from a first position along the transmission line and a second input clock signal phase taken from a second position along transmission line,
  wherein the first phase interpolator is configured to generate one or more interpolated clock signal phases by interpolating between the first input clock signal phase and the second input clock signal phase,
  wherein the first phase interpolator comprises a plurality of ratioed field effect transistors (FETs).

16. The phase interpolation system of claim 15, wherein the plurality of phase interpolators operate as a distributed capacitive load of the transmission line.

17. The phase interpolation system of claim 15, wherein the transmission line comprises a differential transmission line electrically connected in a closed loop, wherein the differential transmission line comprises an odd number of one or more cross-overs, wherein each of the one or more cross-overs is configured to reverse the polarity of a wave propagating along the differential transmission line.

18. The apparatus of claim 10, wherein the tap circuitry further comprises a phase interpolation circuit configured to generate a plurality of interpolated clock signal phases based on interpolating between two or more clock signal phases received by the tap circuitry.

19. The apparatus of claim 18, wherein the phase interpolation circuit comprises a first interpolator comprising a plurality of capacitors electrically connected in series.

20. The apparatus of claim 18, wherein the phase interpolation circuit comprises a first interpolator comprising a plurality of ratioed field effect transistors (FETs).

21. The apparatus of claim 10, further comprising an analog-to-digital converter (ADC) comprising the RTWO system, wherein timing of a counting operation of the ADC is controlled by a plurality of output clock signal phases of the tap circuitry.

\* \* \* \* \*